(12) United States Patent
Elmer et al.

(10) Patent No.: US 6,300,755 B1
(45) Date of Patent: Oct. 9, 2001

(54) ENHANCED MODIFIED FARADAY CUP FOR DETERMINATION OF POWER DENSITY DISTRIBUTION OF ELECTRON BEAMS

(75) Inventors: John W. Elmer, Danville; Alan T. Teruya, Livermore, both of CA (US)

(73) Assignee: Regents of The University of California, Oakland, CA (US)

( * ) Notice: Subject to any disclaimer, the term of this patent is extended or adjusted under 35 U.S.C. 154(b) by 0 days.

(21) Appl. No.: 09/320,226

(22) Filed: May 26, 1999

(51) Int. Cl.[7] ................................................ G01N 27/00
(52) U.S. Cl. ........................ 324/71.3; 324/464; 324/466
(58) Field of Search ................................. 324/464, 466, 324/71.3, 404; 250/251, 305

(56) References Cited

U.S. PATENT DOCUMENTS

| 5,483,036 | 1/1996 | Giedt | 219/121.14 |
|---|---|---|---|
| 5,583,427 | 12/1996 | Teruya et al. | 344/71.3 |

FOREIGN PATENT DOCUMENTS 53-009566  1/1978 (JP) .

OTHER PUBLICATIONS

J.W. Elmer et al, "Fast Method for Measuring Power Density Distribution of Non–circular and Irregular Electron Beams", Science & Technology of Welding and Joining, 1998, vol. 3, No. 2, 51–58 (month unavailable).

J.W. Elmer et al, "Tomographic Imaging of Noncircular and Irregular Electron Beam Current Density Distributions", Welding Research Supplement, Nov. 1993, pp 493–505.

*Primary Examiner*—Glenn W. Brown

(57) ABSTRACT

An improved tomographic technique for determining the power distribution of an electron or ion beam using electron beam profile data acquired by an enhanced modified Faraday cup to create an image of the current density in high and low power ion or electron beams. A refractory metal disk with a number of radially extending slits, one slit being about twice the width of the other slits, is placed above a Faraday cup. The electron or ion beam is swept in a circular pattern so that its path crosses each slit in a perpendicular manner, thus acquiring all the data needed for a reconstruction in one circular sweep. The enlarged slit enables orientation of the beam profile with respect to the coordinates of the welding chamber. A second disk having slits therein is positioned below the first slit disk and inside of the Faraday cup and provides a shield to eliminate the majority of secondary electrons and ions from leaving the Faraday cup. Also, a ring is located below the second slit disk to help minimize the amount of secondary electrons and ions from being produced. In addition, a beam trap is located in the Faraday cup to provide even more containment of the electron or ion beam when full beam current is being examined through the center hole of the modified Faraday cup.

18 Claims, 7 Drawing Sheets

ENHANCED MODIFIED FARADAY CUP FOR DETERMINATION OF POWER DENSITY DISTRIBUTION OF ELECTRON BEAMS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the measurement of the current density distribution in electron and ion beams, particularly to a modified Faraday cup having radial slits therein to create an image of the current density of such beams, and more particularly to an enhanced modified Faraday cup utilizing two spaced slit disks, one disk having one slit wider than the other slits, and a ring to help minimize the amount of secondary electrons and ions from being produced.

Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact the many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method, which utilizes a modified Faraday cup, is exemplified by U.S. Pat. No. 5,382,895, U.S. Pat. No. 5,468,966, U.S. Pat. No. 5,554,926 and U.S. Pat. No. 5,583,427. This electron beam diagnostic method has been utilized, for example, to certify changes in electron beam welders, and is further described in J. W. Elmer et al, "Tomographic Imaging of Non-Circular and Irregular Electron Beam Power Density Distributions," Welding Journal 72 (ii), p. 493-s, 1993; A. T. Teruya et al, "A System for the Tomographic Determination of the Power Distribution in Electron Beams", The Laser and Electron Beam in Welding, Cutting, and Surface Treatment State-of-the-Art 1991, Bakish Materials Corp., p. 125, 1991; and J. W. Elmer et al, "Beam Profile Analysis for the C&MS B231 Electron Beam Welding Machines", LLNL UCRL-ID-127549, Jun. 12, 1997.

The present invention provides an enhancement of the modified Faraday cup (MFC) diagnostic device utilized in the above-referenced patents, and specifically provides an improvement over the MFC of above-referenced U.S. Pat. No. 5,583,427. The enhanced MFC of the present invention improves the quality of the signal that is measured by the MFC, and thus improves the accuracy of the power density distribution measurements. In the MFC of U.S. Pat. No. 5,583,427, the electron beam is oscillated around a tungsten slit disk which samples the beam. The sampled beam current is then measured with an MFC. The MFC of the patent suffers from two problems. First, a substantial percentage of the electron current passing into the Faraday cup could be transported as secondary electrons and/or ions back up to the tungsten slit disk, and therefore would not be properly accounted for. Second, with repeated use, the electrical contact between the tungsten slit disk and the copper heat sink body would degrade. Also, when measuring non-circular beams with the prior MFC, there was no method to orient the measured beam profile with respect to the welding chamber.

The present invention overcomes the above-mentioned electron capture problems by the inclusion of several significant additions to the MFC, of which includes a second slit disk located inside the Faraday cup, a ring added in the Faraday cup below the second slit disk, a beam trap added within the Faraday cup, an improved ground arrangement for the tungsten slit disk, and modifying the tungsten slit disk to orient the beam profile with respect to the welding chamber.

SUMMARY OF THE INVENTION

It is an object of the present invention to provide improved tomographic determination of the power distribution in electron or ion beams.

A further object of the invention is to provide an enhanced modified Faraday cup for fast determination of the power density distribution in non-circular and irregular electron beams.

Another object of the invention is to provide an enhanced modified Faraday cup which includes a shield to eliminate the majority of secondary electrons and ions from leaving the Faraday cup.

Another object of the invention is to provide an enhanced modified Faraday cup which includes means to help minimize the amount of secondary electrons and ions produced.

Another object of the invention is to provide a modified Faraday cup with a beam trap to provide greater containment of an electron beam when the full beam current is being examined through the center hole of the modified Faraday cup.

Another object of the invention is to provide an enhanced modified Faraday cup with improved grounding of the tungsten slit disk.

Another object of the invention is to provide an enhanced modified Faraday cup, wherein the tungsten slit disk is modified to orient properly the beam profile with respect to the welding chamber.

Other objects and advantages of the present invention will become apparent from the following description and accompanying drawings. The present invention involves an enhanced modified Faraday cup (MFC) for fast determination of the power density distribution in non-circular and irregular electron beams. The enhanced MFC utilizes a modified refractory metal slit disk which enables proper orientation of the beam profile with respect to the welding, provides improved grounding of the refractory metal slit disk, utilizes a second slit disk made of copper, for example, and located inside the MFC, utilizes means, such as a graphite ring, below the second slit disk, and utilizes a beam trap in the MFC. Thus, the modification of the prior known MFC which utilizes a refractory metal slit disk, as made in accordance with the present invention, provides an MFC diagnostic device with improved quality of the signal that is measured by the MFC, and thus improves the accuracy of the power density distribution measurements. The enhanced MFC of the present invention may be used for quality control and diagnostic measurements on existing electron beam welding and melting equipment, as well as to assist designers of electron welding and melting equipment to produce better machines.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is directed to an enhanced modified Faraday cup (MFC) for fast determination of the power density distribution in non-circular and irregular electron beams. The invention involves an improvement of the MFC of the system for tomographic determination of power distribution in electron beams of above-referenced U.S. Pat. No. 5,583,427, and improves the electron capture problem of this prior MFC outlined above. In addition the present invention provides a method to orient the measured beam profile with respect to the welding chamber when measuring non-circular electron beams.

The enhanced MFC of this invention broadly involves several modifications, including: (1) enlarging one slit in the refractory metal disk, (2) providing a second slit disk located inside the Faraday cup, (3) a ring located below the second slit disk, (4) a beam trap located below the ring, and (5) improved grounding of the refractory metal disk. By making one slit in the refractory metal disk twice as wide as the other slits, more of the electron beam current passes through the wide slit and into the Faraday cup, which produces a larger signal at this location, and by placing the wide slit in the chamber at a known location, the reconstructed beam profile can be determined with the proper orientation. By providing a second slit disk inside of the Faraday cup, and which may be composed of copper, for example, the second disk provides a shield to eliminate the majority of the secondary electrons and ions from leaving the Faraday cup. The slits in the second disk are the same size as the outer disk, with one slit enlarged, and the slits in the two disks are aligned. By positioning a ring, such as made of graphite, below the second slit disk, it helps minimize the amount of secondary electrons and ions from being produced. By adding a beam trap below the ring, such provides even more containment of the electron beam when full beam current is being examined through the center hole of the MFC. To improve grounding of the outer (refractory metal) slit disk, a wire, such as tantalum, is brazed to the outer slit disk and then attached to the heat sink body, constructed of copper for example. Also, a clamp, such as copper, is employed to maintain pressure on the outer slit disk and thus maintains good electrical contact with the heat sink body. The system in which the enhanced MFC is used is substantially the same as that of above-referenced U.S. Pat. No. 5,583,427, except for the electrical connection illustrated in the FIGS. 5–6 embodiment, and thus is incorporated herein by reference.

Figure 1:
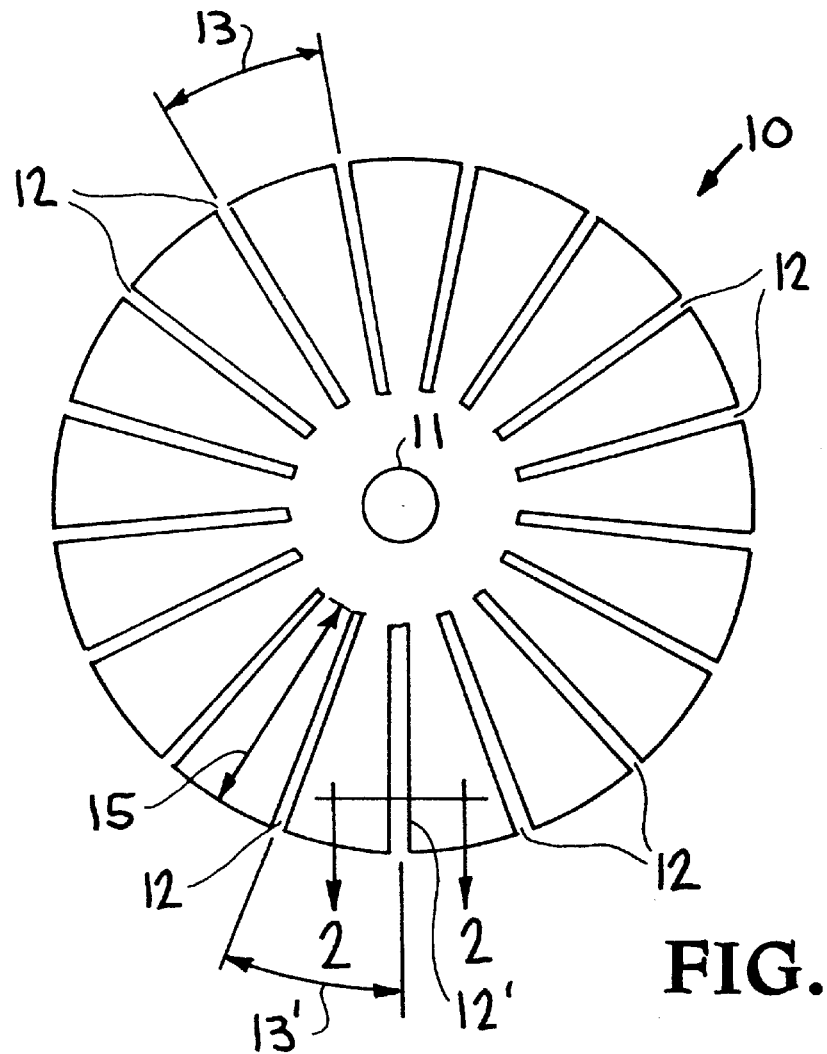
FIG. 1 is an enlarged plan view of a refractory metal disk with radially extending slits, with one of the slits being twice as wide as the other slits.
Figure 2:
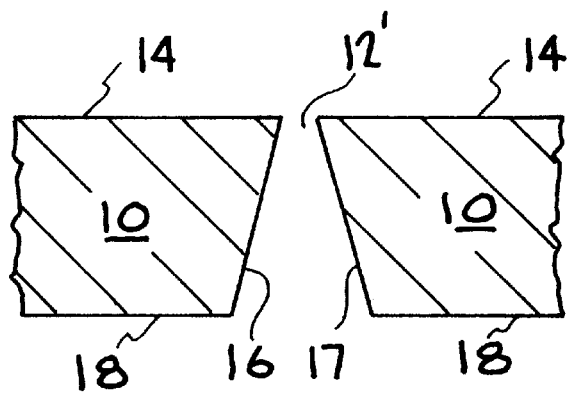
FIG. 2 is a cross-section taken along the line 2—2 of FIG. 1 illustrating a tapered configuration of the slits of the FIG. 1 disk.

Referring now to the drawings, FIGS. 1 and 2 illustrate a refractory metal disk, constructed preferably of tungsten, but may be constructed of tantalum, tungsten-rhenium, or other refractory metals, and is generally indicated at 10. Disk 10 is provided with a center hole 11 and a number (usually odd) of slits 12 extending radially outward from center hole 11 but spaced from said center hole. One of the slits, indicated at 12', is twice as wide as the other slits 12. However, it can be less, such as 1.5 times the width, but must be larger. In this embodiment, the disk 10 contains seventeen (17) slits, composed of 16 slits 12 and one slit 12'. The disk 10 has, for example, a diameter of 1.5 inches and a thickness of 0.125 inch±0.005 inch. The center hole 11 has a diameter of 0.040 inch ±0.002 inch and is ±0.002 from the true center. The slits 12 in disk 10 are equally spaced at 21.18°±0.02°, as indicated by double arrow 13, have a width of 0.004 inch±0.002 inch on the upper surface 14 of disk 10 and a length of 0.500 inch±0.005 inch, as indicated by double arrow 15, and terminate a distance of about 0.250 inch from the true center hole 11. The wider slit 12' has the same length as slits 12, with a width of 0.008 inch±0.002 inch on the surface 14 of disk 10, and slit 12' is spaced from adjacent slits 12 by a reduced distance due to the slit 12' being twice as wide, and thus the center of slit 12', for example, is spaced from the center of adjacent slits 12 at 21:18°±0.020°, as indicated by the double arrow 13'. The center-to-center spacing should be the same.

FIG. 2 is a cross-section of a section of disk 10 and widened slit 12' looking radially outwardly in the direction of arrows 2—2 of FIG. 1, wherein the slit 12' has tapered surfaces 16 and 17 tapering outwardly and downwardly from upper surface 14 to a lower surface 18 of disk 10. The slits 12 and slit 12' are tapered, beveled, etc. to remove material of the disk 10 behind the slits in surface 14 of the disk to improve sensitivity and prevent beam reflections and/or secondary electrons, while providing adequate heat dissipation generated by the electron beam crossing the slits 12 and 12'. The tapered surfaces 16 and 17 are exemplified as being at a 10° angle and can be increased or decreased by about 2–4 degrees.

Figure 3:
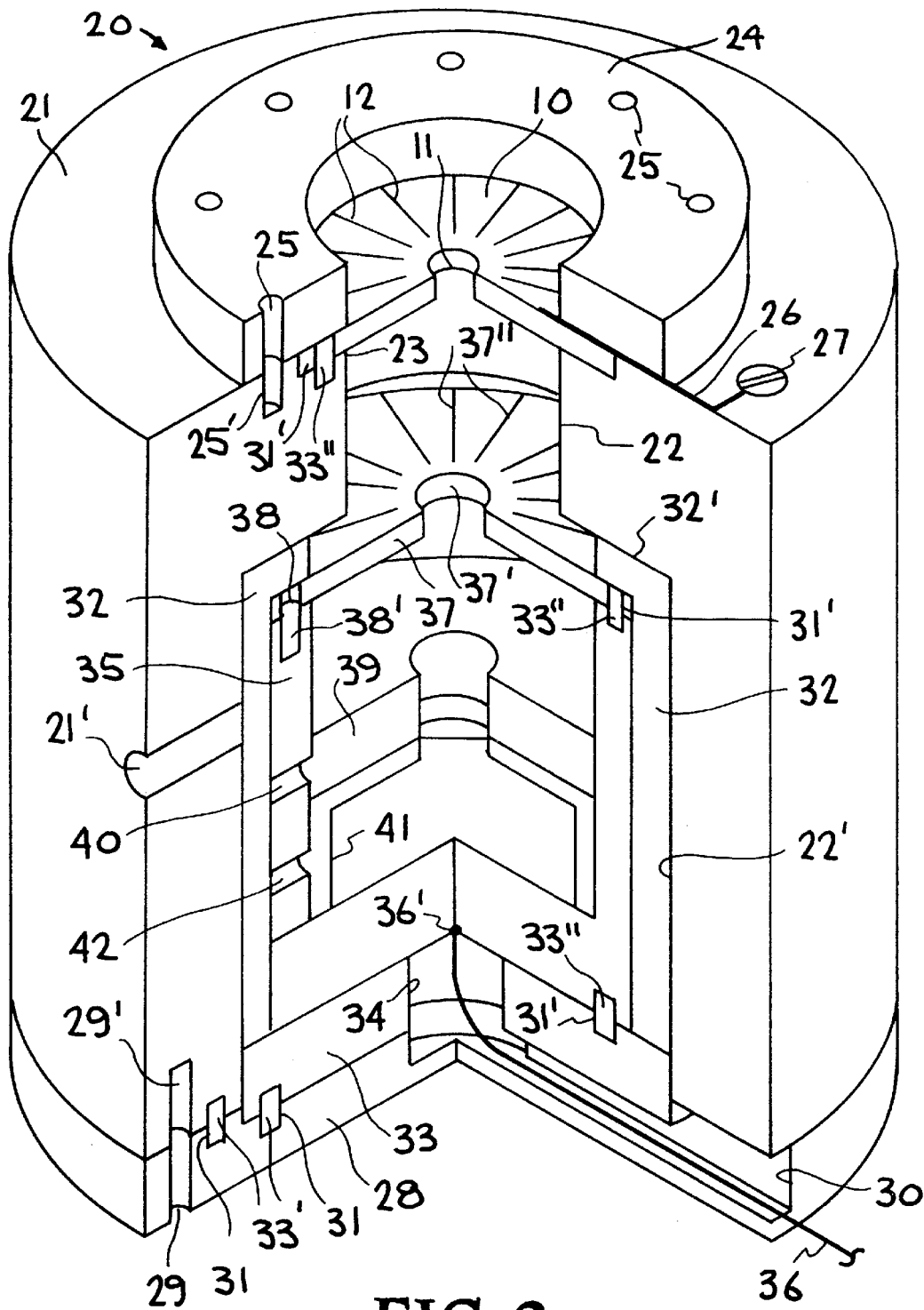
FIG. 3 is a partial cross-section of an embodiment of the enhanced modified Faraday cup of the present invention, which incorporates the slit disk of FIGS. 1 and 2.

FIG. 3 is a partial cross-section of an embodiment of the enhanced MFC, made in accordance with the present invention, generally at 20 having an outer shield or heat sink body 21, made of high electrically conductive metal or alloy, such as copper, silver or steel, with an opening extending therethrough composed of sections 22 and 22', opening section 22 being of a smaller diameter than opening section 22', and with a cutaway or counter-sink 23 about the outer end of opening section 22. A slit refractory metal, preferably tungsten, disk 10, as shown in FIGS. 1 and 2 is positioned in counter-sink 23 and secured in heat sink body 21 by a clamp or plate 24 made of copper, silver or steel via bolts, screws, etc., located in openings 25 in plate 24 and in opening 25' in heat sink body 21.

An electrical ground, such as a wire 26, made of, for example, tantalum, copper, or silver, is brazed or otherwise secured to the slit disk 10 and attached to the heat sink body 21 via a screw 27, for example. Outer shield or heat sink body 21 includes a lower plate section 28, also constructed of copper, silver or steel, for example, and secured to heat sink body 21 by bolts or screws extending through openings 29 and 29' therein, only one each shown. Plate section 28 includes a radially extending passageway or groove 30 and a cutaway or counter-sink 31. Positioned within opening section 21 of heat sink body 21 is a liner or insulator 32 composed, for example, of Macor ceramic, alumina, and boron nitride; and an annular bottom cap or plate 33 also composed of Macor ceramic, alumina, boron nitride, or other insulator material. Liner 32 may be secured by screws extending through opening 21' in heat sink body 21. The annular bottom cap or plate 33 includes a central opening 34 which aligns with groove 30 in plate section 28 and is provided with a protruding pin 33' that fits into cutaway 31. A Faraday cup 35, constructed of copper, silver or steel, is located within liner 32 and abuts annular cap 33, and a signal wire 36, such as a shielded copper wire, is secured to the bottom of Faraday cup 35, as indicated at 36', and extends outwardly via opening 34 in cap 33 and groove 30 in plate section 28. Positioning in the upper end of Faraday cup 35 is a second slit disk 37, constructed of copper, silver, tantalum, or tungsten having a center hole 37' and slits 37" which align with center hole 11 and slits 12–12' of disk 10. The second disk 37 is secured to Faraday cup 35 by bolts, screws, etc. extending in openings 38 and 38' in disk 37 and the Faraday cup 35, only one each shown. Liner or insulator 32 includes an inwardly extending flange 32' which extends over the periphery of the second disk 37. Located within Faraday cup 35 and below the second disk 37 is a ring 39, constructed of graphite, copper, or tantalum, which is secured therein by bolts, screws, etc., which extends through openings 40 in Faraday cup 35, only one shown. Located in Faraday cup 35 below ring 39 is a beam trap 41, constructed of copper, silver, or steel, and secured in the Faraday cup 35 by bolts, screws, etc., extending through openings 42 in Faraday cups 35, only one shown. Faraday cup 35 is aligned with plate 33 by a cutaway/pin arrangement, indicated at 31'/33". The second slit disk 37 is aligned with Faraday cup 35 and the first slit disk 10 is aligned with heat sink body 21 via cutaway/pin arrangements 31'/33" as seen in FIG. 3.

Figure 4:
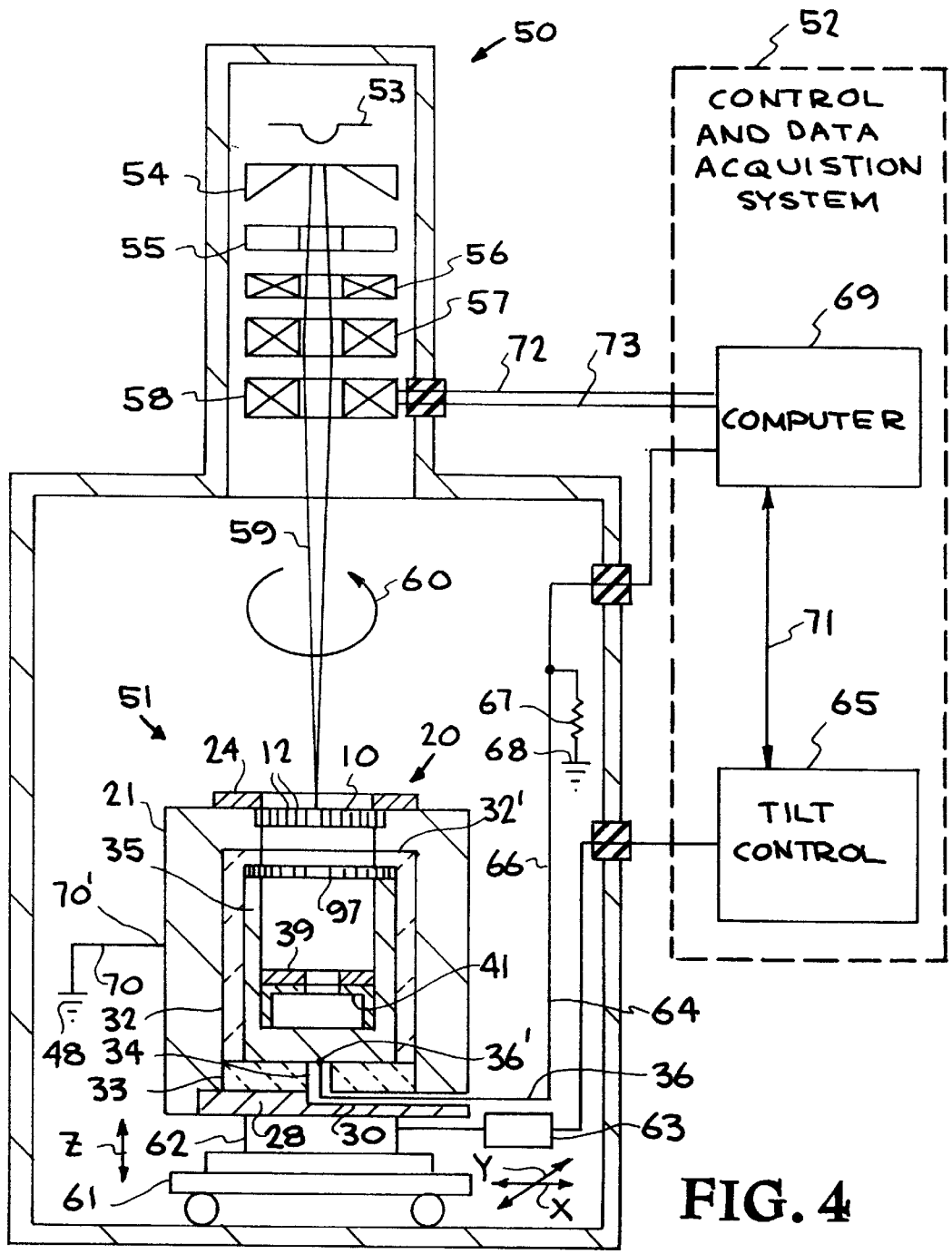
FIG. 4 schematically illustrates an embodiment of a system for determining the power density distribution in high power electron beams, with components of the enhanced modified Faraday cup of the present invention schematically shown therein.

FIG. 4 schematically illustrates an embodiment of the enhanced modified Faraday cup 20 illustrated in FIG. 3 and incorporating the slit disk 10 of FIG. 1 in a system for taking electron beam profile data. The system of FIG. 4 involves three (3) interconnected components or sub-systems: an electron beam gun generally indicated at 50, a modified Faraday cup (MFC) assembly generally indicated at 51, and a control and data acquisition system 52. System 52 functions to control elements of the gun 50 and the MFC assembly 51 as well as storing the acquired data. The system of FIG. 4, except for the enhanced MFC 20, is the same as that of above-referenced U.S. Pat. No. 5,583,427.

The electron beam gun 50, such as may be used in a welding machine, basically comprises a filament 53, cathode 54, anode 55, alignment coil 56, magnetic lens 57, and deflection coil 58. The filament 53 may be of any desired configuration, such as a ribbon type or a hairpin type as known in the art. The various components of gun 50, and detail of filament 53 are known in the art. The deflection coil 58 is connected so as to be controlled by system 52 to deflect an electron beam produced by gun 50 and indicated at 59 in a circular pattern as indicated by arrow 60. The beam 59 is moved via deflection coil 18 to sweep across each of the slits 12 and 12' in the slit disk 10 in the enhanced MFC 20 of the MFC assembly 51 as the beam 59 is deflected in a circular pattern as indicated by arrow 60.

The enhanced MFC 20, such as the embodiment illustrated in detail in FIG. 3, is mounted on a movable assembly 61, via a support member 62 and an actuator 63 connected via line 64 to a tilt controller 65 of control and data acquisition system 52. The movable assembly 61, composed of x, y, and z translation stages as indicated by the double arrows x, y, and z, provides the capability of movement of enhanced MFC 20 as desired to accurately align the slits 12 and 12' of slit disk 10 with the electron beam 59 as it moves in a circular pattern around the disk 10, as discussed in greater detail hereinafter. The electrical contact 36 of MFC 20 (see FIG. 3) is connected via an electrical cable or lead 66 to a current viewing or sensing resistor 67 and to a common ground as indicated at 68, and to a computer 69 of system 52. The voltage across the resistor 67 is measured and stored in computer 69 for each slit 12 and 12' as beam 59 passes thereacross. Housing 21 of MFC 20 is electrically connected to the common ground 48 via a cable or lead 70 connected to electrical contact 70'. By way of example, the resistor 67 may be 100 ohms.

The control and data acquisition system 52 consists of computer 69 and tilt controller 65, with computer 69 being connected to tilt controller 65 via a cable or lead 71 and to deflection coils 58 of electron gun 50 via leads or cables 72 and 73. To accurately position the MFC 20 with respect to the sweep of the electron beam 59 across the slits 12 of disk 10, the computer 69 through tilt controller 65 actuates actuator 63 to move the movable assembly 61 in any desired direction. To initiate acquisition of beam profile data via MFC 20 the electron gun 50 is turned on and the computer 69 activates deflection coils 58 of electron gun 50 to move the beam 59 in a circular pattern so as to cross each slit 12 and 12' of disk 10, and receives the output data from MFC 20 via lead 66 and resistor 47. Thus, a single computer is used to generate the signals actuating the electron beam sweep, to acquire the data from the MFC, and to do the reconstruction of the beam profile data to produce a tomographic profile of the power distribution in the electron beam.

Because each of the angular profiles is acquired using a different slit 12 slit or 12' in slit disk 10, it is important that the slit disk be accurately centered on and made perpendicular to an undetected beam. In order to facilitate this the small hole 11 has been drilled in the center of the slit disk. The disk may then be centered on the beam 59 by moving the MFC 20 around, via movable assembly 61, until a signal read across the sensing resistor 67 indicates that the center hole 11 is aligned with the beam 59. If the slit disk 10 is tilted and the slits 12 are not perpendicular to the beam, then the beam path through some of the slits 12 will be narrowed or cut off completely since the slit disk has a thickness that is much larger than the width of the slits. Tilt of the MFC 20 is checked by sweeping the beam 59 in its circular pattern, indicated by arrow 60, and adjusting the tilt via tilt controller 65, or manually adjusted, and assembly 61 until a clear signal comes through each slit.

The problem of sensitivity to tilt may be minimized by removing material behind the top surface forming the slits so that only material at the top surface 14 of the slit disk 10 forms the slits 12 and 12' while remembering that it is important to provide as much disk material possible to adequately dissipate heat generated by the electron beam. FIG. 2 illustrates an approach to solving the tilt sensitivity problem by tapering the walls of the slits 12 and 12' as indicated at 16 and 17 so that the walls are not perpendicular to the front or top surface 14 of slit disk 10. The slits in the second slit disk need not be tapered as in the disk 10, but must be large enough to let all electrons pass through. Instead of the tapered configuration of wall surfaces 16 and 17 in FIG. 2, the wall surfaces could be leveled or otherwise configured such that the bottom of the slits is wider than the width of the slits at the top surface 14 of disk 10.

Figure 5:
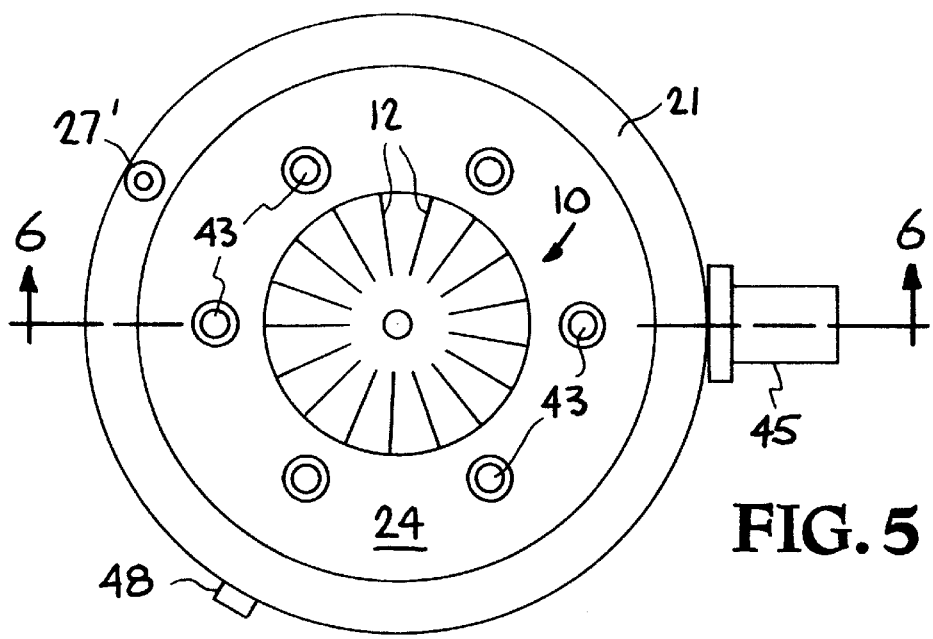
FIGS. 5 and 6 illustrate plan and cross-sectional views of an embodiment of the enhanced modified Faraday cup of the present invention, illustrating how components thereof are mounted together with a coaxial-type electrical connection added to the base.
Figure 6:
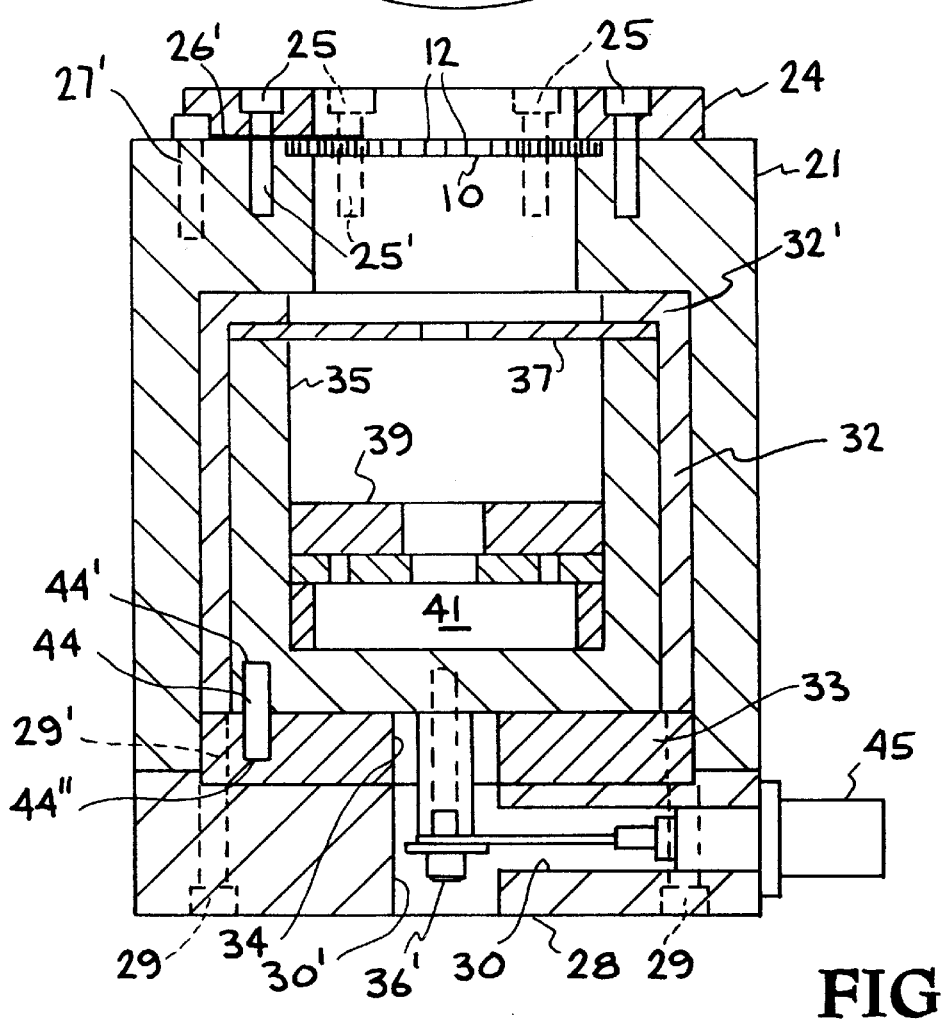

The embodiment of the enhanced MFC illustrated in FIGS. 5 and 6 is generally similar to that of FIG. 3, and thus corresponding components will be given a corresponding reference numeral. The principal difference between the embodiments of FIGS. 5–6 and 3 is the addition in FIGS. 5–6 of a coaxial type electrical connector, such as a common BNC connector, in place of the signal wire 36 of FIG. 3. As seen in FIG. 5, bolts 43 extend into openings 25 and 25' of the plate 24 and heat sink body 21, and as seen in FIGS. 5 and 6, the ground wire 26' is secured by screw 27' and extends from slit disk 10 under plate 24. As shown in FIG. 6, a pin 44 extends into holes 44' and 44" in Faraday cup 35 and the bottom cap or plate 33. Plate section 28, in addition to the passageway or groove 30, is provided with an opening 30' which aligns with opening 34 of bottom cap or plate 33. A BNC connector 45 is mounted in passageway or groove 30 and connected to an electrical contact 36' secured to the bottom of Faraday cup 35, whereby electrical signals are passed via BNC connector 45 to computer 69 via lead or cable 66, as shown in FIG. 4.

Figure 7:
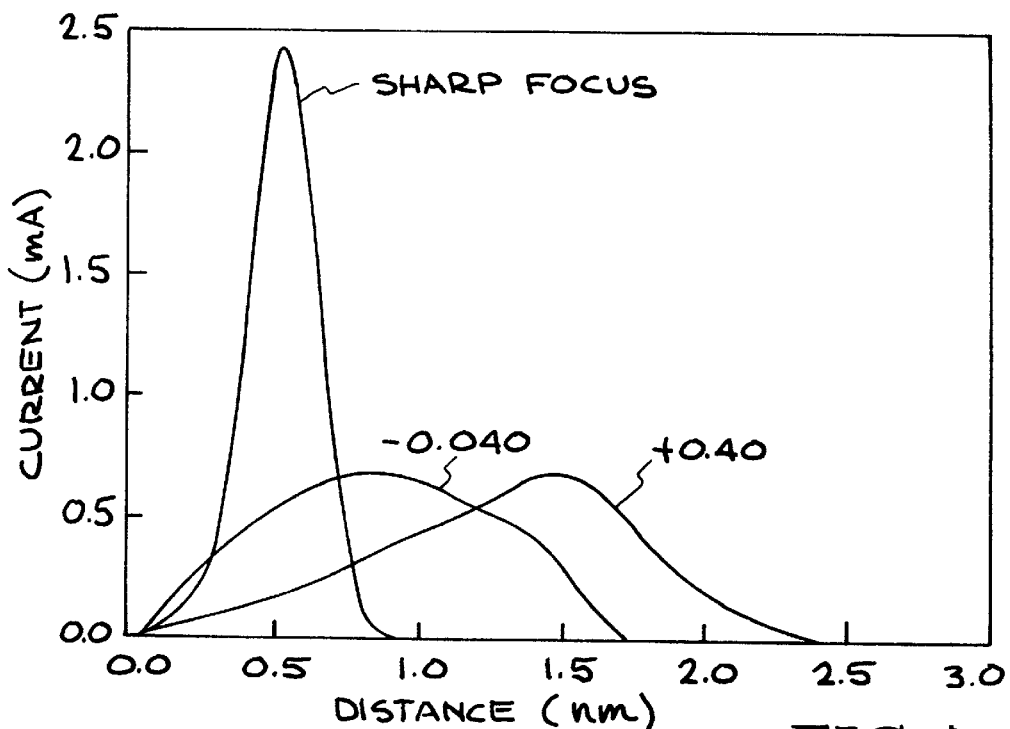
FIG. 7 graphically illustrates individual beam profiles as measured through the wide slit in the disk of FIG. 1.

Electron beam welds are made by first determining the "sharp focus" condition, which is used as a reference point, and then setting the welding focus above, below, or directly on this sharp focus to produce the desired weld properties. Without the use of diagnostic tools, the sharp focus condition is somewhat subjective and is generally determined by the electron beam operator. By use of computer tomography (CT), such as described in above-referenced U.S. Pat. No 5,583,427 and by using a tungsten slit disk having one wider slit, as shown in FIGS. 1 and 2, the power density distribution was measured as a function of focus coil setting for electron beams at 80 and 140 kV generated by a 150 kV, 50 mA Hamilton-Standard electron beam welder, fitted with a ribbon filament and an R-40 electron gun. Both beams were set at 5.0 mA and the beam's current was verified using a conventional Faraday cup. The work distance was kept constant at 200 mm from the top of the weld chamber and the pressure in the chamber was maintained at $5 \times 10^{-5}$ torr ($7 \times 10^2$ Pa). The results of these experimental measurements are illustrated in FIGS. 7–12, and are set forth in detail in J. W. Elmer, et al "Fast method for measuring power density distribution of non-circular an irregular electron beams," Science and Technology of Welding and Joining, 1998, Vol., 3, No 2, p. 51–58. The experiments were conducted by dynamically finding the beam profile generated by the wide slit in the tungsten slit disk. These measurements showed that the sharp focus setting for the 80 kV beam was 0.555A, and that for the 140 kV beam it was 0.748A. Electron beam power density measurements were then made on a series of beams in 0.005A increments of defocus. One set of data was taken from sharp focus up to +0.040A, with a corresponding set of data down to –0.040A, of defocus relative to the sharp focus setting for each beam. The effect of 0.040A of defocus on the beam was quite dramatic. This difference is most easily recognized by comparing the single slit beam profiles of sharp and defocused beams. FIG. 7 shows this effect for beam profiles at –0.040A and +0.040A defocus settings relative to the sharp focus condition for the 140 kV, 5.0 mA beam.

Figure 8:
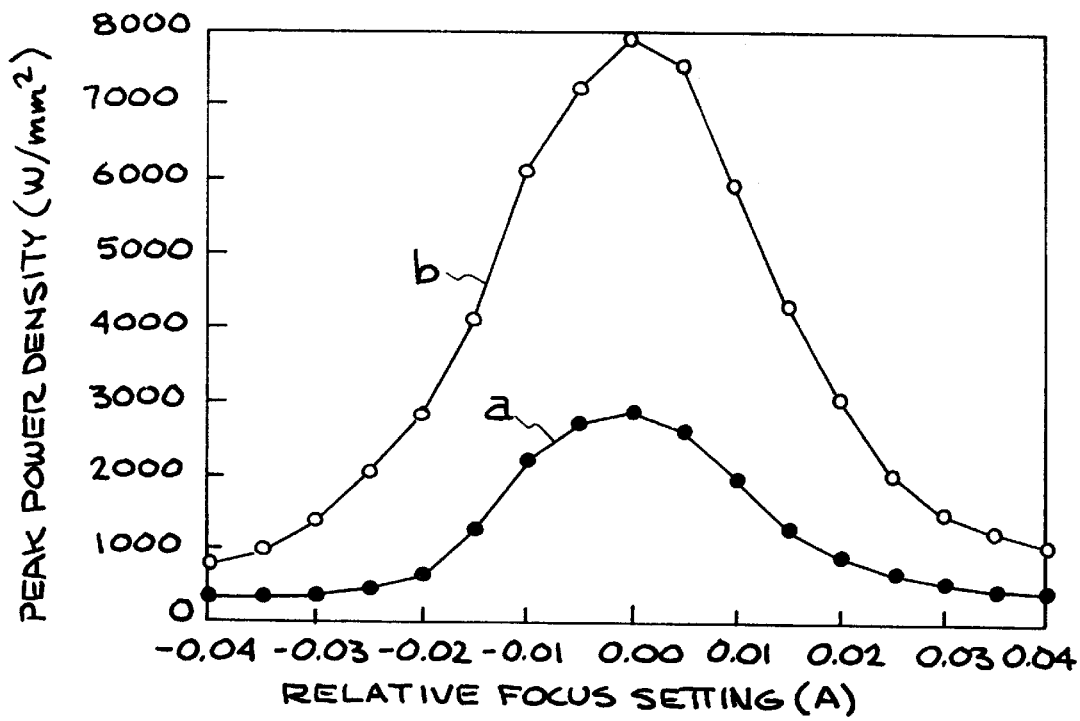
FIG. 8 graphically illustrates the effect of focus setting (in amperes) on peak power density of a beam at given accelerating voltages of (a) 80 KV and (b) 140 KV.

FIG. 8 shows plots of peak power density for both the 80 kV beam (plot a) and the 140 kV beams (plot b) as a function of relative focus setting (5 mA). Both beams show similar behavior in that the peak power density appears to have a slightly asymmetric Gaussian shape, with higher power densities occurring for equivalent amounts of defocus both above the sharp focus setting and below. The ratio of peak power densities for the 140 and 80 kV beams remains relatively constant at ~2.8:1 throughout the range of relative focus settings from –0.040A to +0.040A.

Figure 9:
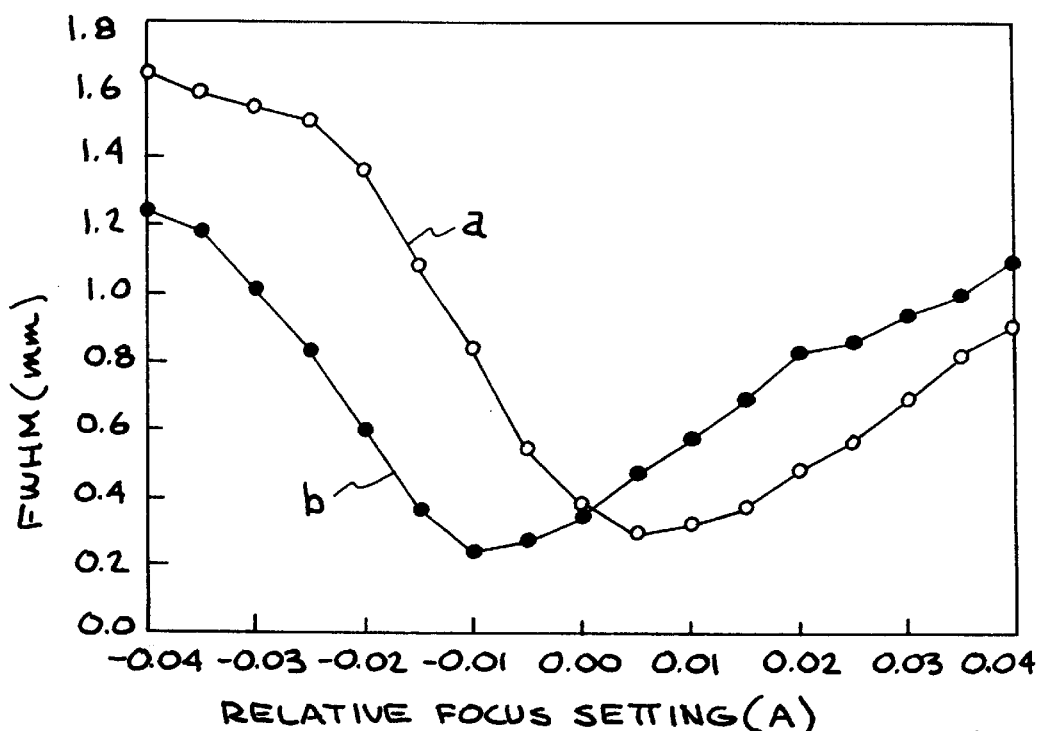
FIGS. 9 and 10 illustrate plots of FWHM as a function of focus setting for 5 mA beams at given accelerating voltages of 80 kV and 140 kV, respectively; each figure shows the FWHM along major and minor axes of elliptical beams which occur at given rotations from horizontal.

FIG. 9 shows a plot of FWHM values for both axes of the 80 kV beam at relative focus setting from –0.040A to +0.040A. Each principal axis has a minimum FWHM (minor axis dimension) that occurs at different focus settings. Along the 55° axis (plot indicated at a), the minimum FWHM is 0.24 mm and occurs at a relative focus setting of –0.010A. Along the 140° axis (plot indicated at b), the minimum FWHM is 0.29 mm and occurs at relative focus setting of +0.005A. The sharpest focus condition lies between these two focal points; at the relative focus setting of 0, the beam is almost circular with a FWHM of 0.36 mm. As the beam is defocused to either side of the sharp focus setting, the FWHM of the beam increases substantially, reaching nearly five times the minimum value with a 0.040A of defocus.

Figure 10:
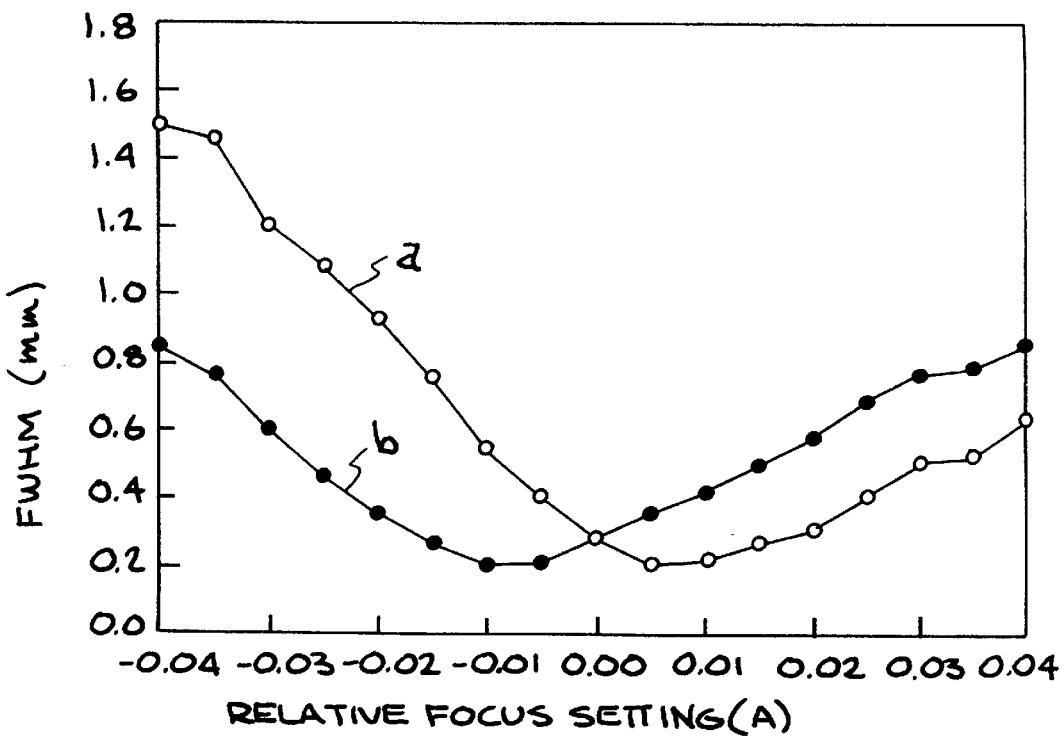

FIG. 10 shows plots a and b of FWHM values for both axes of the 140 kV beam at relative focus settings from –0.040A to +0.040A. The overall results are similar to those for the 80 kV beam of FIG. 9, where each principal axis has a minimum value that occurs at different focus settings. However, the 140 kV beam is more compact with lower FWHM values than the 80 kV beam. Along the 55° axis, a, the minimum FWHM of the 140 kV beam is 0.20 mm and occurs at a relative focus setting of –0.010A. Along the 140° axis, b, the minimum FWHM is 0.020 mm and occurs at a relative focus setting of +0.005A. Again, the sharpest focus condition lies between these two focal points and, at a relative focus setting of 0, the beam is almost circular with a FWHM of 0.28 mm.

Figure 11:
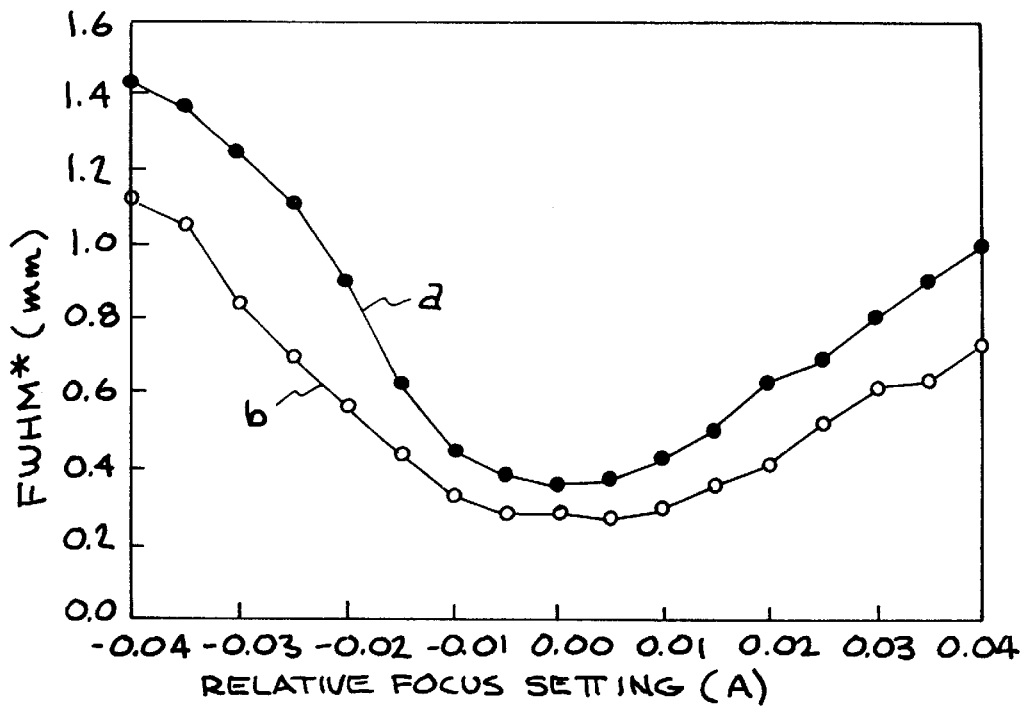
FIG. 11 illustrates a plot of FWHM* as a function of focus setting (in amperes) for given accelerating voltages of (a) 80 KV and (b) 140 KV.
Figure 12:
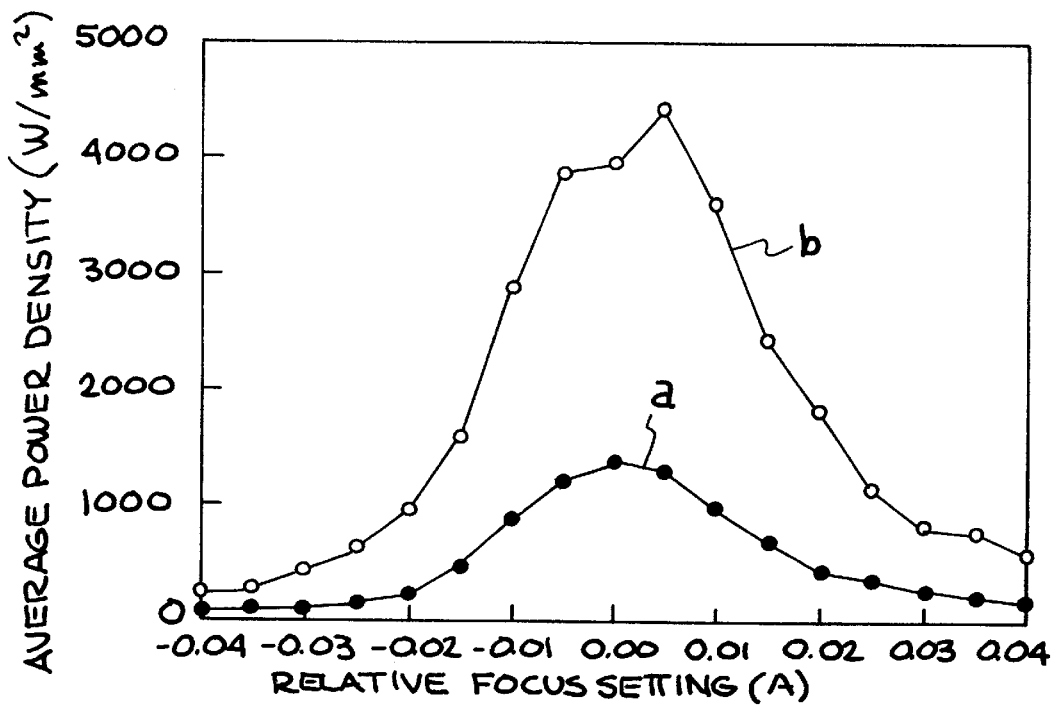
FIG. 12 graphically illustrates the effect of focus setting on average power density of a 5 mA beam at given accelerating voltages of (a) 80 KV and (b) 140 KV.

FIG. 11 shows FWHM* for the 80 and 140 kV beams, indicated at a and b, as a function of relative focus setting and demonstrates that the minimum FWHM* of the 80 kV beam (plot a) is 0.36 mm and that of the 140 kV beam (plot b) is 0.27 mm. The value FWHM* is the FWHM of a circular Gaussian beam that would have the same area as that of the measured elliptical shape and falls between the two extremes. Since FWHM* can be thought of as the average FWHM of the beam, this comparison shows the average difference in power density distribution for a 5.0 mA beam operating under two different accelerating voltages. Both beams follow similar trends with focus, showing larger increase in FWHM* for defocus settings below the sharpest focus setting than for settings above the sharpest focus setting. The non-idealities of the electron optics system that are responsible for this asymmetry are not known at the present time.

The results of the FWHM* measurements show that the 140 kV beam consistently focuses more precisely with FWHM* ~0.75 times that of the 80 kV beam. The ability of the 140 kV beam to produce more lightly focused beams accounts for the disproportionately high peak power densities observed at 140 kV, compared with 50 kV for the same beam current.

The average power density is another useful way to compare different beams as long as a consistent definition is used. The definition used herein for the average power density is the total beam power divided by the effective beam area, $\pi(\text{Fwe2*})^2/4$. The average power density measurement for each of the 80 kV and 140 kV beams has been calculated, and these data are plotted at a and at b, respectively, in FIG. 12, which shows the change in average power density with focus settings for both the 140 and 80 kV beams. As shown, the trend of average power density with focus, is very similar to that of peak power, with the exception that the 140 kV beam has a maximum average power density shifted slightly, to a relative focus setting of +0.005A.

The average power density of the sharp focused 140 kv electron beam, measured on an apparatus using the tungsten slit disk (one wide slit) of FIGS. 1 and 2, was $4.3 \times 10^3$ Wmm$^{-2}$ and this beam had a peak intensity of $7.9 \times 10^3$ Wmm$^{-2}$.

It has thus been shown that the present invention provides an enhanced MFC for use in a system for tomographic determination of the power distribution in electron beams. The present invention can be utilized with high-power, high-intensity multiple kilowatt (20 kv plus) electron beams, or with low-power (1 kv) beams, as well as for the analysis of ion beams. Thus, the intention is not limited only to electron beam applications, such as used in welding machines, but has a wide application for the analysis of any type of energy producing beams, such as the generation of x-rays or use in electron beam lithography.

While particular embodiments, materials, and parameters have been set forth to exemplify and teach the principles of the invention, such are not intended to be limiting. Modifications and changes may become apparent to those skilled in the art, and it is intended that the invention be limited only by the scope of the appended claims.

What is claimed is:

1. In a system for tomographic determination of the power distribution in electron beams which includes a Faraday cup having a disk position thereabove with radially extending slits therein, and means for collecting data from the Faraday cup, the improvement comprising:

said disk being of a refractory metal and one of said radially extending slits being greater in width than the other of said radially extending slits, and a second disk having radially extending slits therein located in an upper section of said Faraday cup.

2. The improvement of claim 1, wherein said one of said radially extending slits has a width of up to twice as wide as the other radially extending slits.

3. The improvement of claim 1, wherein each of said slits has a configuration along a length thereof which increases in width from an upper surface of said disk to a lower surface of said disk.

4. The improvement of claim 1, additionally including alignment pins for aligning said disks.

5. The improvement of claim 1, wherein said second disk is constructed of a conductive material.

6. The improvement of claim 1, additionally including a ring positioned in said Faraday cup in spaced relation beneath said second disk.

7. The improvement of claim 6, wherein said ring is constructed of material selected from the group consisting of graphite, copper, tantalum, and similar electron collecting materials.

8. The improvement of claim 6, additionally including a beam trap located in said Faraday cup beneath said ring.

9. The improvement of claim 1, additionally including a BNC connection electrically connected to said Faraday cup as a portion of said means for collecting data therefrom.

10. The improvement of claim 1, additionally including a member for retaining said refractory metal disk to a heat sink body positioned around said Faraday cup.

11. The improvement of claim 10, additionally including an electrical grounding element connected intermediate said refractory metal disk and said heat sink body, and retained by said member.

12. An enhanced modified Faraday cup, including:

a Faraday cup positioned in a heat sink body, means connected to said Faraday cup for collecting data therefrom, a refractory metal disk having a central opening and radially extending slits therein, said disk having one of said radially extending slits with a width greater than widths of the other radially extending slits, means for retaining said disk on said heat sink body and in alignment with said Faraday cup, and another disk having a central opening and radially extending slits positioned in an upper section of said Faraday cup.

13. The enhanced modified Faraday cup of claim 12, wherein said another disk is constructed of electrically conductive material selected from the group consisting of copper, silver, tungsten, tantalum, and similar materials, and wherein said radially extending slits are aligned with said radially extending slits in said refractory material disk.

14. The enhanced modified Faraday cup of claim 12, wherein said means for collecting data from said Faraday cup includes a BNC connection operatively connected to a bottom section of said Faraday cup.

15. The enhanced modified Faraday cup of claim 12, additionally including an electrical ground element interconnecting said refractory material disk and said heat sink body, and wherein said means for retaining said disk on said heat sink body retains said electrical ground element against said heat sink body for maintaining electrical contact between said disk and said heat sink body.

16. The enhanced modified Faraday cup of claim 12, additionally including a ring located in said Faraday cup and spaced from said another disk.

17. The enhanced modified Faraday cup of claim 16, wherein said ring is constructed of material selected from the group consisting of graphite, copper, tantalum, and similar electron collecting materials.

18. The enhanced modified Faraday cup of claim 16, additionally including a beam trap located in said Faraday cup beneath said ring, and constructed of a conductive material.

* * * * *